United States Patent
Jeong et al.

(10) Patent No.: US 11,713,518 B2
(45) Date of Patent: Aug. 1, 2023

(54) METHOD FOR FORMING CHALCOGENIDE THIN FILM

(71) Applicant: POSTECH Research and Business Development Foundation, Pohang-Si (KR)

(72) Inventors: Unyong Jeong, Pohang-si (KR); Giri Anupam, Pohang-si (KR); Geonwoo Kim, Pohang-si (KR); Ghorai Arup, Pohang-si (KR)

(73) Assignee: POSTECH RESEARCH AND BUSINESS DEVELOPMENT FOUNDATION, Gyeonsangbuk-Do (KR)

( * ) Notice: Subject to any disclaimer, the term of this patent is extended or adjusted under 35 U.S.C. 154(b) by 10 days.

(21) Appl. No.: 17/569,098

(22) Filed: Jan. 5, 2022

(65) Prior Publication Data
US 2022/0213619 A1    Jul. 7, 2022

(30) Foreign Application Priority Data

Jan. 6, 2021 (KR) .......................... 10-2021-0001456
Jan. 6, 2021 (KR) .......................... 10-2021-0001519
Jan. 4, 2022 (KR) .......................... 10-2022-0000830

(51) Int. Cl.
*C30B 7/14* (2006.01)
*C30B 29/46* (2006.01)
(Continued)

(52) U.S. Cl.
CPC ............... *C30B 29/46* (2013.01); *C30B 7/14* (2013.01); *C30B 30/04* (2013.01); *H01L 21/02293* (2013.01); *H01L 21/02422* (2013.01)

(58) Field of Classification Search
CPC  C30B 29/46; C30B 7/14; C30B 30/04; H01L 21/02293; H01L 21/02422
See application file for complete search history.

(56) References Cited

U.S. PATENT DOCUMENTS 6,607,969 B1 *  8/2003  Kub .................... H01L 21/8221
                                                                438/54
6,875,661 B2 *  4/2005  Mitzi ................ H01L 21/02568
                                                                438/285
(Continued)

FOREIGN PATENT DOCUMENTS

WO     WO-2019/058467 A1     3/2019

OTHER PUBLICATIONS

Sean Keuleyan, et.al., "A Silicon-Based Two—Dimensional Chalcogenide: Growth of Si2Te3 Nanoribbons and Nanoplates", Nano Lett. 2015.
(Continued)

*Primary Examiner* — Robert M Kunemund
(74) *Attorney, Agent, or Firm* — Harness, Dickey & Pierce, P.L.C.

(57) ABSTRACT

Provided is a method for forming a chalcogenide thin film, the method including forming a chalcogen element-containing film on a carrier substrate, disposing the chalcogen element-containing film on a silicon wafer, wherein the surface of the silicon wafer and the surface of the chalcogen element-containing film are in contact with each other, performing heat treatment on the silicon wafer and the chalcogen element-containing film at least one time, and removing the carrier substrate. The silicon wafer has a crystal plane of (111).

18 Claims, 26 Drawing Sheets

(51) Int. Cl.
*C30B 30/04* (2006.01)
*H01L 21/02* (2006.01)

(56) References Cited

U.S. PATENT DOCUMENTS

| | | | |
|---|---|---|---|
| 7,094,651 B2* | 8/2006 | Mitzi | H01L 29/66742 |
| | | | 438/285 |
| 2003/0186521 A1* | 10/2003 | Kub | H10N 30/073 |
| | | | 438/558 |
| 2007/0111468 A1* | 5/2007 | Xie | H01L 21/76256 |
| | | | 438/424 |
| 2020/0127198 A1 | 4/2020 | Cui et al. | |
| 2020/0211841 A1 | 7/2020 | Hiraga | |

OTHER PUBLICATIONS

S.V. Tikhov. et.al., "Role of highly doped Si substrate in bipolar resistive switching of silicon nitride", Microelectronic Engineering 187-188 (2018).

* cited by examiner

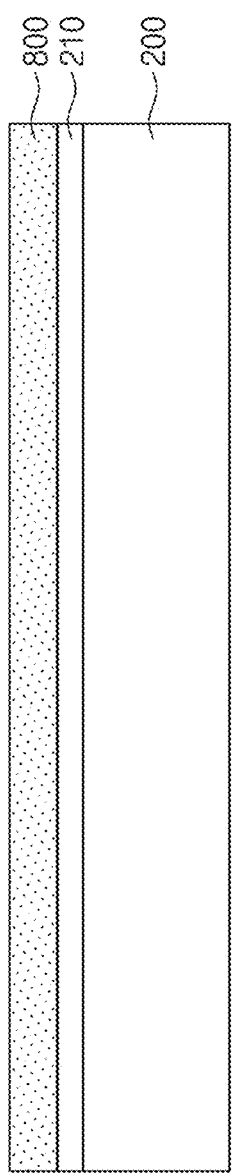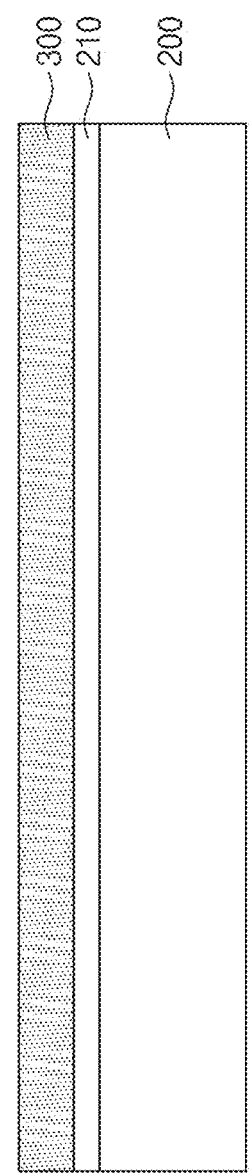

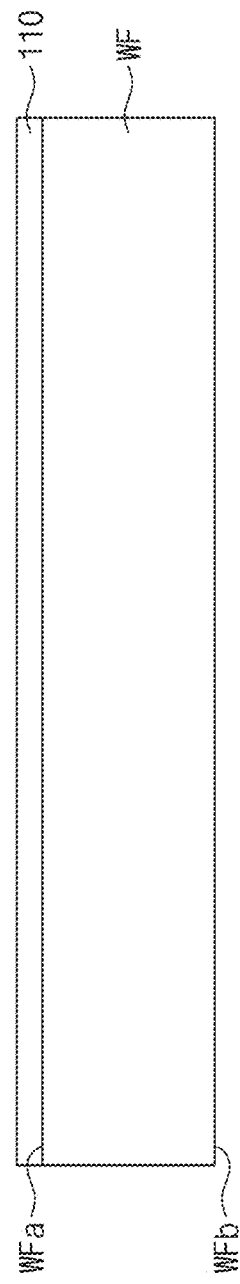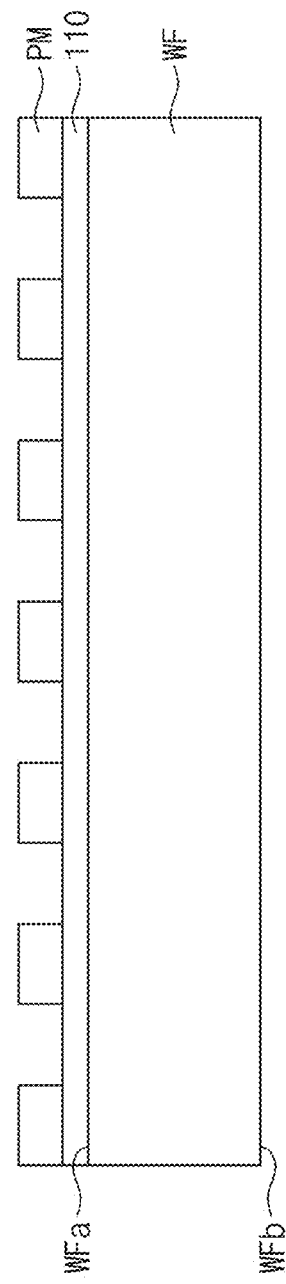

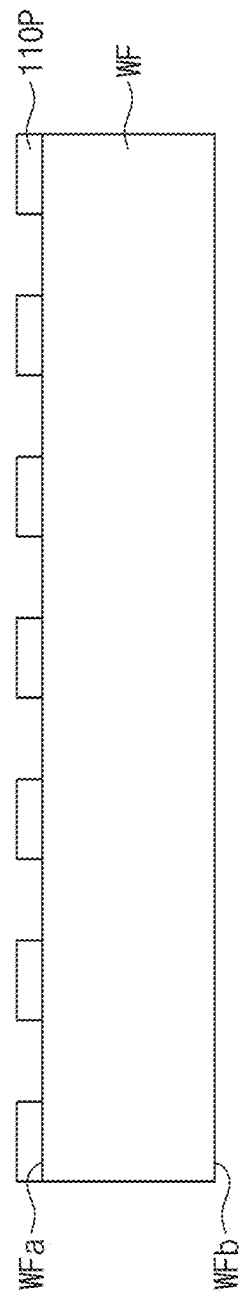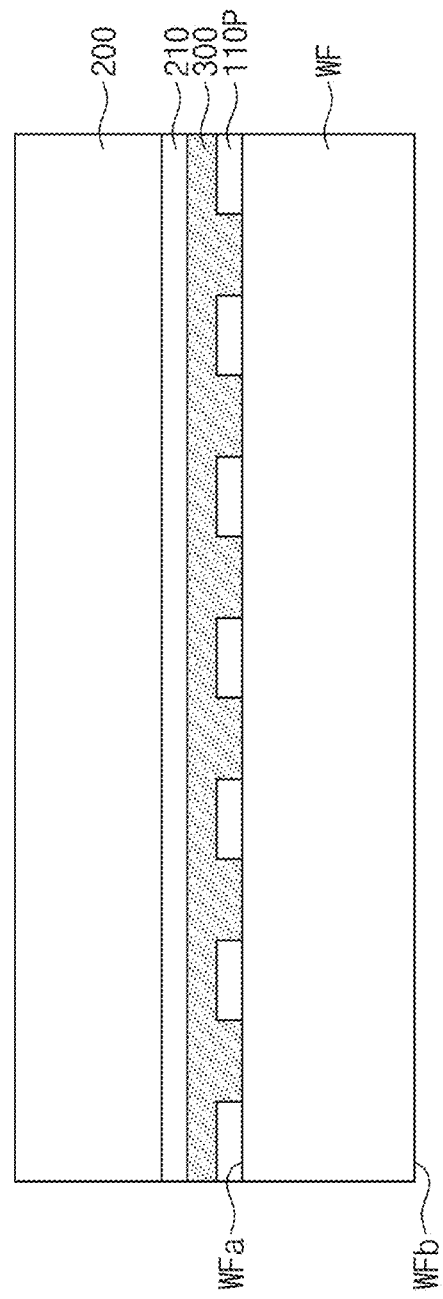

METHOD FOR FORMING CHALCOGENIDE THIN FILM

CROSS-REFERENCE TO RELATED APPLICATIONS

This U.S. non-provisional patent application claims priority under 35 U.S.C. § 119 of Korean Patent Application No. 10-2021-0001456, filed on Jan. 6, 2021, the entire contents of which are hereby incorporated by reference.

BACKGROUND

The present disclosure herein relates to a method for forming a chalcogenide thin film, and more specifically, to a method for forming a single-crystal chalcogenide thin film on a wafer.

A two-dimensional (2D) transition metal chalcogenide has attracted attention for its many properties, including band gap, carrier density, polarity, and rapidly emerging unique optical properties. In addition, the two-dimensional metal chalcogenide has been considered an ideal platform for exploring new physical properties of optoelectronics, charge density waves, and low-dimensional superconductivity. Considering the potential benefits of a metal chalcogenide in next-generation devices, studies on the high-throughput synthesis of high-quality single-crystal thin films on the entire surface of a substrate for forming a device are being conducted.

SUMMARY

The present disclosure provides a method for forming a single-crystal chalcogenide thin film in a large area without a transfer process.

The object to be achieved by the present invention is not limited to the object mentioned above, and other objects not mentioned will be clearly understood by those skilled in the art from the following description.

An embodiment of the inventive concept provides a method for forming a chalcogenide thin film, the method including forming a chalcogen element-containing film on a carrier substrate, disposing the chalcogen element-containing film on a silicon wafer, wherein the surface of the silicon wafer and the surface of the chalcogen element-containing film are in contact with each other, performing heat treatment on the silicon wafer and the chalcogen element-containing film at least one time, and removing the carrier substrate, wherein the silicon wafer has a crystal plane of (111).

In an embodiment of the inventive concept, a method for forming a chalcogenide thin film includes preparing a carrier substrate on which a barrier layer is formed, forming a chalcogen element-containing film on the barrier layer, forming an insulation pattern on a semiconductor substrate, wherein the insulation pattern exposes a portion of an upper surface of the semiconductor substrate, disposing the chalcogen element-containing film on the insulation pattern, wherein the chalcogen element-containing film comes into contact with the exposed upper surface of the semiconductor substrate, and performing heat treatment on the semiconductor substrate and the chalcogen element-containing film at least one time.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 3A, and FIG. 3B are cross-sectional views schematically showing a forming process for forming a chalcogenide thin film of FIG. 1A;

FIG. 5A to FIG. 5G are cross-sectional views schematically showing a forming process of a semiconductor device including a chalcogenide thin film;

DETAILED DESCRIPTION

Hereinafter, in order to describe the present invention in more detail, embodiments according to the present invention will be described in more detail with reference to the accompanying drawings.

FIG. 1A, FIG. 1B, FIG. 1C, and FIG. 1D are cross-sectional views schematically showing methods for forming a chalcogenide compound thin film according to embodiments of the inventive concept.

Figure 1A:
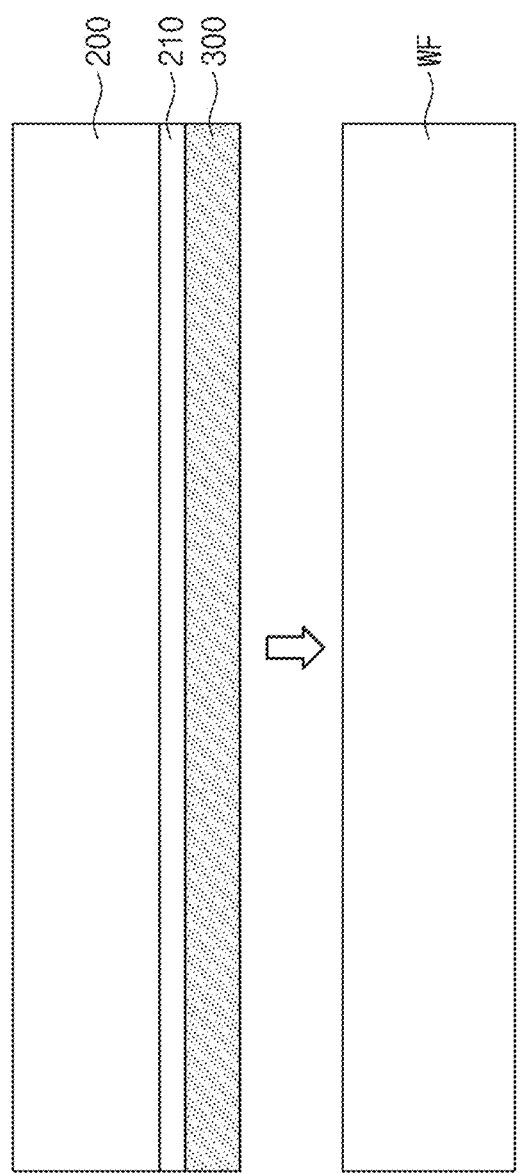
FIG. 1A, FIG. 1B, FIG. 1C, and FIG. 1D are cross-sectional views schematically showing methods for forming a chalcogenide compound thin film according to embodiments of the inventive concept.

Referring to FIG. 1A, a semiconductor wafer WF may be provided. The semiconductor wafer WF may have a diameter of 2 inches or more, and may have a larger area than this (ex: 4 inches, 8 inches, etc.). The semiconductor wafer WF may include at least one of silicon (Si), germanium (Ge), gallium (Ga), or arsenic (As). The semiconductor wafer WF may be a substrate including a material having crystallinity. As an example, when the semiconductor wafer WF includes at least one of silicon and germanium, the semiconductor wafer WF may have a crystal plane of (111). As another example, when the semiconductor wafer WF includes at least one of gallium (Ga) and arsenic (As), the semiconductor wafer WF may have a (100) crystal plane.

On the semiconductor wafer WF, a chalcogen element-containing film 300 may be disposed. In a process to be described later, the chalcogen element-containing film 300 may be pressured to be in close contact with the semiconductor wafer WF.

According to some embodiments, a process of removing an oxide film naturally formed on the semiconductor wafer WF may be further included before the chalcogen element-containing film 300 is disposed. As an example, the process of removing an oxide layer may be performed by immersing the semiconductor wafer WF for 30 to 60 seconds in a solution including any one of a hydrogen fluoride (HF) aqueous solution, a hydrogen chloride (HCl) aqueous solution, and a buffered oxide etchant (BOE). When the semiconductor wafer WF is immersed in the solution for less than 30 seconds, the oxide layer is not sufficiently removed, and when the semiconductor wafer WF is immersed in the solution for more than 60 seconds, the surface of the silicon wafer may be damaged after the oxide layer is removed. As an example, the hydrogen fluoride (HF) aqueous solution may have a concentration of 2.5 to 5 wt %. When the concentration of the hydrogen fluoride (HF) aqueous solution is less than 2.5 wt %, the oxide film on the surface of the semiconductor wafer WF may not be sufficiently removed. When the concentration of the hydrogen fluoride (HF) aqueous solution is greater than 5 wt %, it is difficult to control the removal rate of the oxide film.

According to some embodiments, the chalcogen element-containing film 300 may be a transition metal chalcogenide-containing film. The transition metal chalcogenide film may include a chalcogen element and a transition metal element. The chalcogen element may include at least one of sulfur (S), tellurium (Te), or selenium (Se). The transition metal element may include at least one of molybdenum (Mo) and tungsten (W). The transition metal element may be combined with the chalcogen element to constitute a transition metal chalcogenide. The transition metal chalcogenide film may be in a solid-state form.

According to some embodiments, the chalcogen element-containing film 300 may be an amorphous carbon film containing chalcogen particles. The chalcogen element may be provided in amorphous carbon in a particle form (a mixture form). At this time, the size of a particle may be from several to several hundreds of micrometers. The amorphous carbon film containing chalcogen particles may be in a solid-state form.

According to some embodiments, the chalcogen element-containing film 300 may be a silicone oil solution in which chalcogen particles are dispersed. The chalcogen particles may be dispersed in silicone oil (a mixture form). The silicone oil solution in which chalcogen particles are dispersed may be in a liquid-state form. When the silicone oil solution in which chalcogen particles are dispersed is used, and when bringing a carrier substrate 200 and the semiconductor wafer WF into close contact with each other, it is advantageous to make uniform contact conditions therebetween.

The chalcogen element-containing film 300 may be coated on the carrier substrate 200. The carrier substrate 200 may be, for example, a conductive substrate. The conductive substrate may include any one of a silicon wafer doped with impurities and a silicon wafer having ITO, FTO, and graphene transferred on the surface thereof. As an example, the conductive substrate may be a p-doped silicon wafer.

Between the chalcogen element-containing film 300 and the carrier substrate 200, a barrier film 210 may be interposed. The barrier film 210 may include an insulation film. The barrier film 210 may include any one among $SiO_2$, $GeO_2$, GeO, GaO, and $Ga_2O_3$. The barrier film 210 may prevent the chalcogen element from being diffused to the carrier substrate 200 in the following process, thereby suppressing side reactions of the chalcogen element.

Figure 1B:
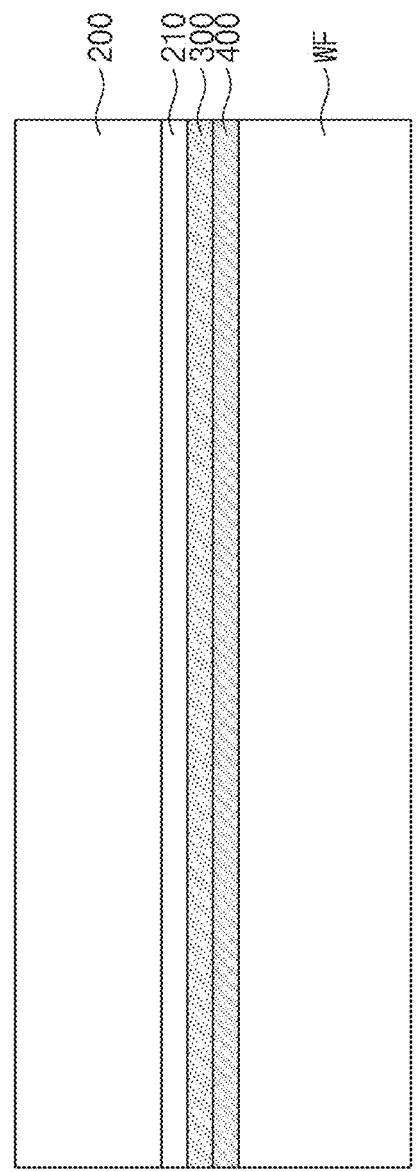

Referring to FIG. 1A and FIG. 1B, a heat-treatment process may be performed at least one time while the chalcogen element-containing film 300 is being in contact with the surface of the semiconductor wafer WF.

According to some embodiments, the heat-treatment process may be performed in an inert gas atmosphere for 1 to 10 minutes at 400° C. to 800° C. As an example, the heat-treatment process may be performed for 3 to 6 minutes at 600° C. to 750° C. When the heat treatment is performed at lower than 400° C., there is no reaction occurring between an element constituting the semiconductor wafer WF and the constituent element, so that it is difficult to form a thin film. When the heat treatment is performed at greater than 850° C., a thin film with a rough surface is formed. When the heat treatment is performed for less than 1 minute, there may not be a sufficient reaction occurring between an element constituting the semiconductor wafer WF and the chalcogen element, and when the heat treatment is performed for greater than 10 minutes, a thin film with a rough surface is formed.

The inert gas may include at least one of nitrogen (N$_2$), helium (He), neon (Ne), argon (Ar), krypton (Kr), or xenon (Xe). The inert gas may further include hydrogen (H$_2$). The flow rate at which the inert gas is introduced may be 10 to 60 L/min. As an example, the flow rate of the inert gas may be 30 to 50 L/min. When the flow rate at which the inert gas is introduced is less than 10 L/min, other oxides may be formed in the chalcogenide thin film due to a reaction with oxygen in the air. When the flow rate at which the inert gas is introduced is greater than 60 L/min, a thin film with a rough surface is formed.

By the heat-treatment process, the chalcogen element of the chalcogen element-containing film 300 and the element constituting the semiconductor wafer WF may react with each other.

Specifically, the chalcogen element of the chalcogen element-containing film 300 may be melted. The chalcogen element forms a droplet on the semiconductor wafer WF. A material (ex: Si) constituting the semiconductor wafer WF may be continuously dissolved until saturation in the droplet is achieved. Nucleation begins between the droplet and the surface of the semiconductor wafer WF. Through the diffusion between the droplet and the surface of the semiconductor wafer WF, the material (ex: Si) constituting the semiconductor wafer WF is supplied to the droplet.

A plurality of nuclei may be grown to epitaxially grow into a plurality of crystal grains. Thereafter, neighboring crystal grains may meet each other and be rearranged to form a single-crystal chalcogenide thin film 400 having a uniform crystal plane.

The chalcogenide thin film 400 may be composed of a compound of any one among silicon (Si), germanium (Ge), and gallium (Ga), which are semiconductor elements, and the chalcogen element. As an example, the chalcogenide thin film 400 may include any one among silicon telluride (Si$_2$Te$_3$), germanium telluride (GeTe), germanium selenide (GeSe), and gallium telluride (GaTe). The chalcogenide thin film 400 may have a crystal plane of (001).

Figure 1C:
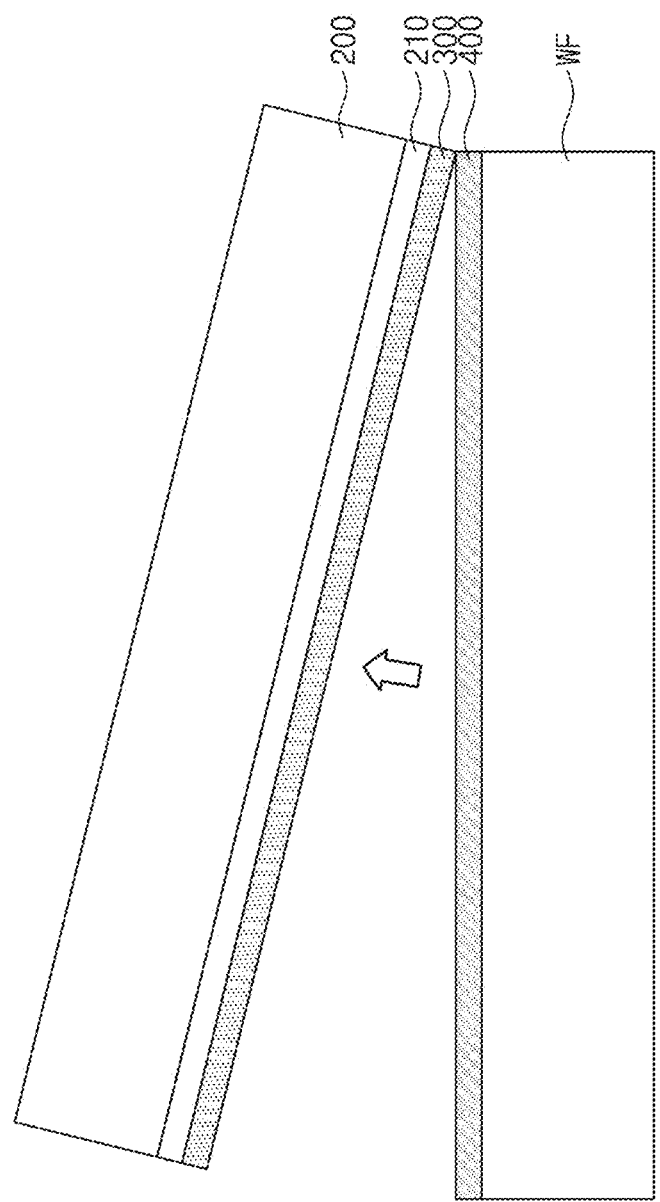
Figure 1D:
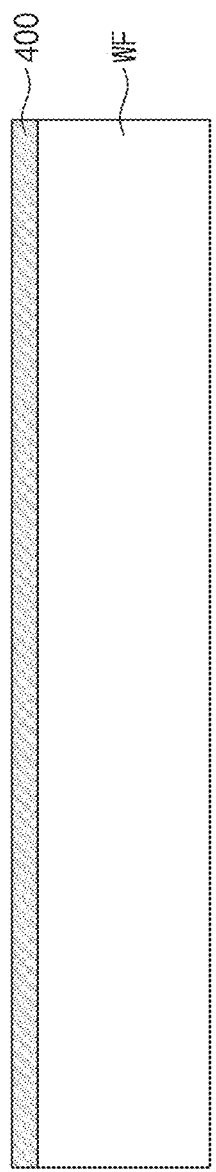

Referring to FIG. 1C, the carrier substrate 200 may be removed. A process of removing the carrier substrate 200 may be a process of separating the carrier substrate 200 from the semiconductor wafer WF using physical force. The chalcogen element-containing film 300 not reacted may also be removed together. As a result, as shown in FIG. 1D, the surface of the chalcogenide thin film 400 on the semiconductor wafer WF may be exposed to the outside. The chalcogenide thin film 400 may include any one among silicon telluride (Si$_2$Te$_3$), germanium telluride (GeTe), germanium selenide (GeSe), and gallium telluride (GaTe) of a single crystal. The crystal structure of the chalcogenide thin film 400 may have an epitaxial relationship with the crystal plane of the semiconductor wafer WF.

Figure 2A:
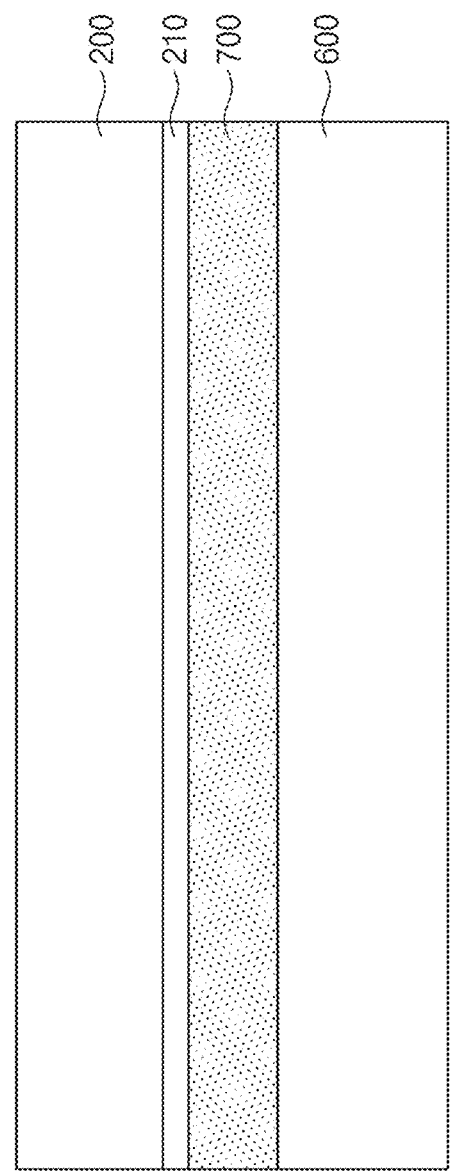
FIG. 2A, FIG. 2B, and FIG. 2C are cross-sectional views schematically showing a forming process for forming a chalcogenide thin film of FIG. 1A.
Figure 2B:
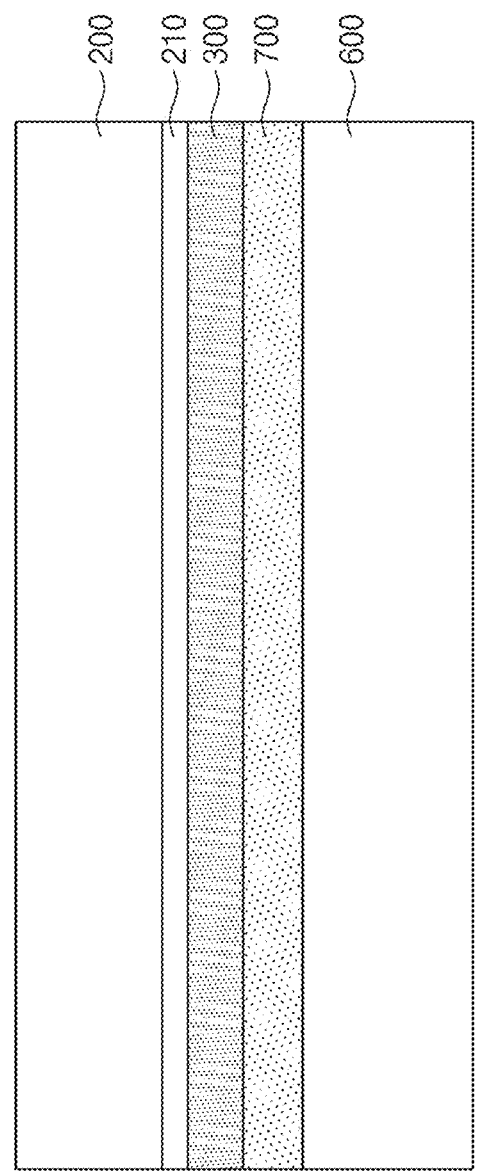
Figure 2C:
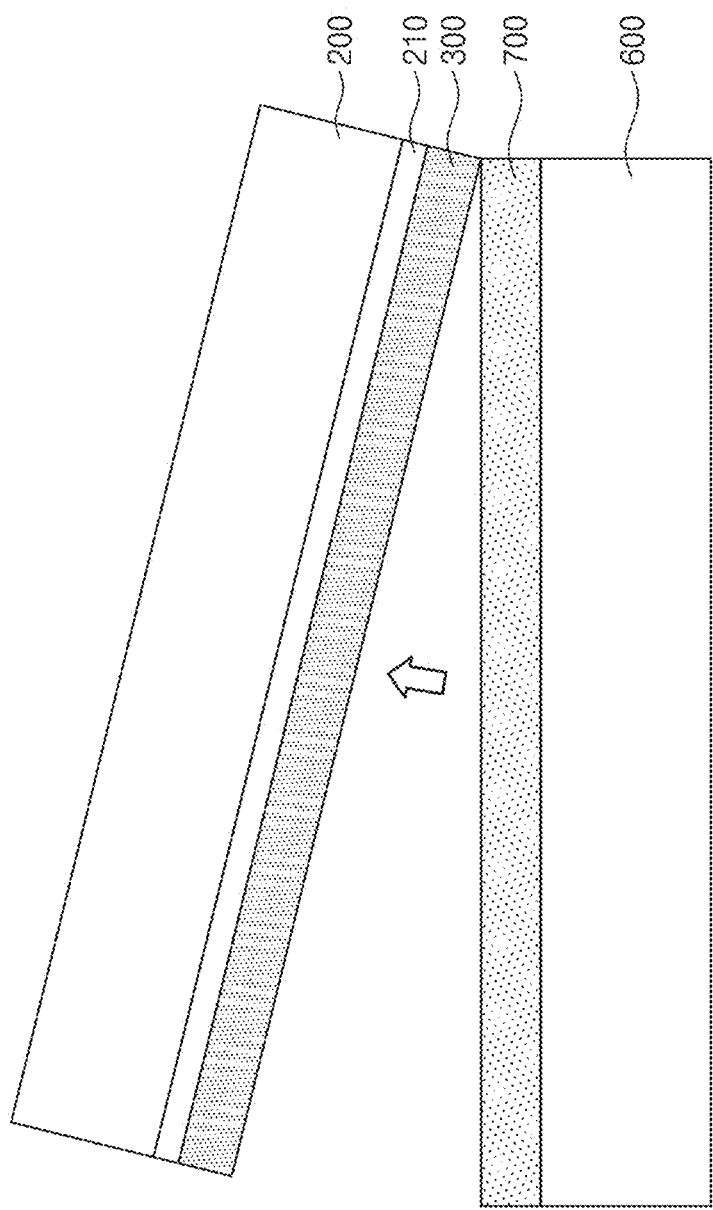

FIG. 2A, FIG. 2B, and FIG. 2C are cross-sectional views schematically showing a forming process for forming a chalcogenide thin film of FIG. 1A.

Referring to FIG. 2A, a first mixed solution 700 may be coated on the carrier substrate 200. Before the first mixed solution 700 is coated on the carrier substrate 200, the barrier film 210 may have already been formed on the carrier substrate 200. The first mixed solution 700 may include a chalcogenide precursor, a transition metal precursor, and an ionic liquid. After the first mixed solution 700 is coated on the carrier substrate 200, the first mixed solution 700 may be covered by a cover member 600 such that the first mixed solution 700 is uniformly coated on the carrier substrate 200.

Referring to FIG. 2B, the carrier substrate 200 and the first mixed solution 700 may be irradiated with microwaves. The chalcogenide precursor and the transition metal precursor may react with each other to form a transition metal chalcogenide film (the chalcogen element-containing film 300). Thereafter, as shown in FIG. 2C and FIG. 2D, the cover member 600 and the first mixed solution 700 which is not reacted may be removed from the carrier substrate 200.

FIG. 3A, and FIG. 3B are cross-sectional views schematically showing a forming process for forming a chalcogenide thin film of FIG. 1A.

Referring to FIG. 3A, a second mixed solution 800 may be coated on the carrier substrate 200. The second mixed solution 800 may include a chalcogen precursor and a polymer solution. The polymer solution refers to a solution in which a polymer is dissolved in an organic solvent. The second mixed solution 800 may be coated on the carrier substrate 200 using a coating method such as spin coating.

Referring to FIG. 3B, the carrier substrate 200 and the second mixed solution 800 may be irradiated with microwaves. The polymer in the second mixed solution 800 becomes amorphous carbon, and the chalcogenide precursor may be reduced to form chalcogen particles of a micrometer size. As a result, an amorphous carbon thin film (the chalcogen element-containing film 300) containing chalcogen particles may be formed. When microwaves are applied to the second mixed solution 800, a reaction occurs well even if energy is not uniform, so that it is possible to form the chalcogen element-containing film 300 in a large area.

Figure 4:
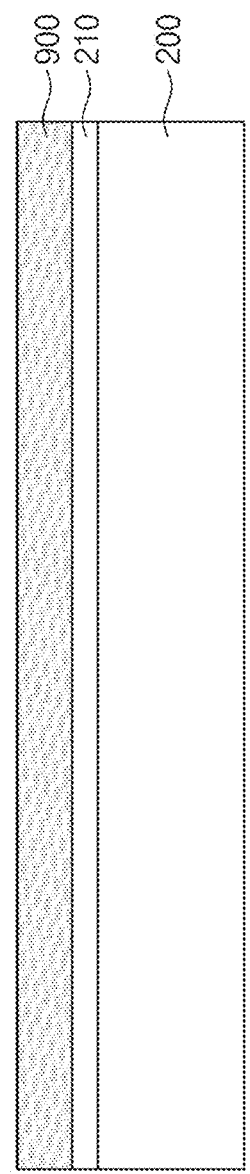
FIG. 4 is a cross-sectional view schematically showing a forming process for forming a chalcogenide thin film of FIG. 1A.

FIG. 4 is a cross-sectional view schematically showing a forming process for forming a chalcogenide thin film of FIG. 1A.

Referring to FIG. 4, a third mixed solution 900 may be coated on the carrier substrate 200. The third mixed solution 900 may include chalcogen particles and silicone oil. According to some embodiments, the third mixed solution 900 may further include an organic solvent. The third mixed solution 900 may be coated on the carrier substrate 200 using a method such as spin coating. The third mixed solution 900 may correspond to the chalcogen element-containing film 300 of FIG. 1A.

FIG. 5A to FIG. 5G are cross-sectional views schematically showing a forming process of a semiconductor device including a chalcogenide thin film. Except for those to be described below, descriptions which are the same as those described with reference to FIGS. 1A to 1D will be omitted.

Referring to FIG. 5A, a semiconductor wafer WF having a first surface WFa and a second surface WFb facing each other may be provided. As an example, the semiconductor wafer WF may be a silicon wafer doped with impurities. The semiconductor wafer WF may have an insulation film 110 formed on the first surface WFa. As an example, the insulation film 110 may be a silicon oxide film. As an example, the insulation film 110 may be formed through a method such as RF sputtering.

Referring to FIG. 5B, a photoresist pattern PM may be formed on the insulation film 110. The photoresist pattern PM may be formed through the formation, exposure, and development of a photoresist layer.

Referring to FIG. 5B and FIG. 5C, an etching process may be performed using the photoresist pattern PM as an etching mask. By the etching process, the insulation film 110 is patterned to form an insulation pattern 110P. The insulation pattern 110P may include openings, and the openings may expose a portion of the first surface WFa of the semiconductor wafer WF.

Referring to FIG. 5D, on the first surface WFa of the semiconductor wafer WF, a carrier substrate 200 coated with a chalcogen element-containing film 300 may be provided.

Between the chalcogen element-containing film 300 and the carrier substrate 200, a barrier film 210 may be provided. The chalcogen element-containing film 300 may be pressured to be in contact with the first surface WFa of the semiconductor wafer WF.

Figure 5E:
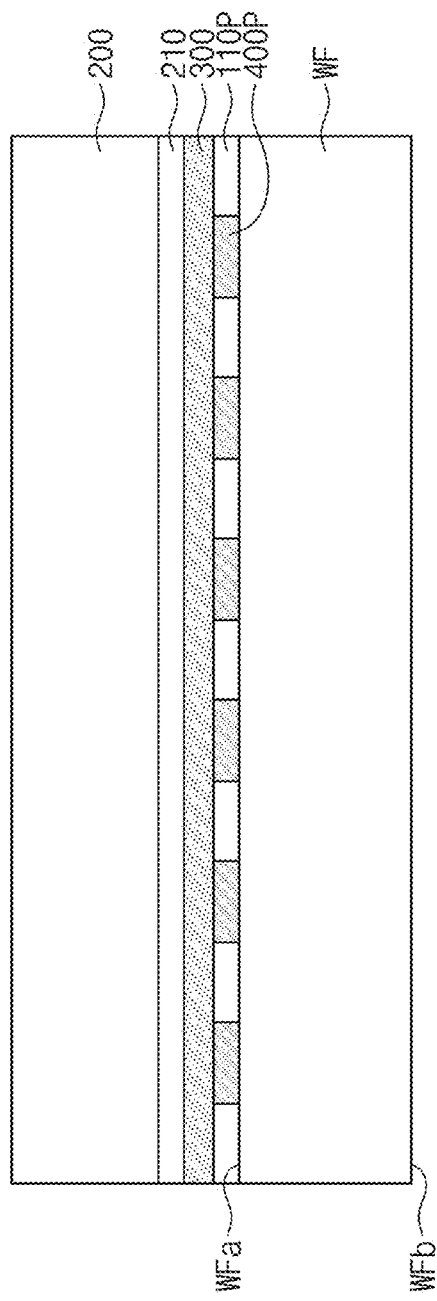

Referring to FIG. 5E, a reaction may occur between a chalcogen element of the chalcogen element-containing film 300 and a material (ex: Si) constituting the semiconductor wafer WF by heat treatment, so that chalcogenide thin film patterns 400P may be formed. The chalcogenide thin film patterns 400P may all have the same crystal direction. As an example, the chalcogenide thin film patterns 400P may all have the crystal direction of (001). The chalcogenide thin film patterns 400P may have an epitaxial crystal relationship with the semiconductor wafer WF.

Figure 5F:
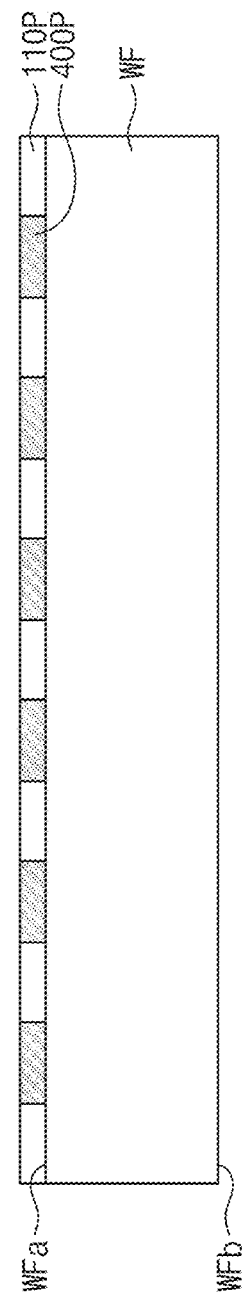

Referring to FIG. 5F, the carrier substrate 200 and the chalcogen element-containing film 300 which is not reacted may be removed.

Figure 5G:
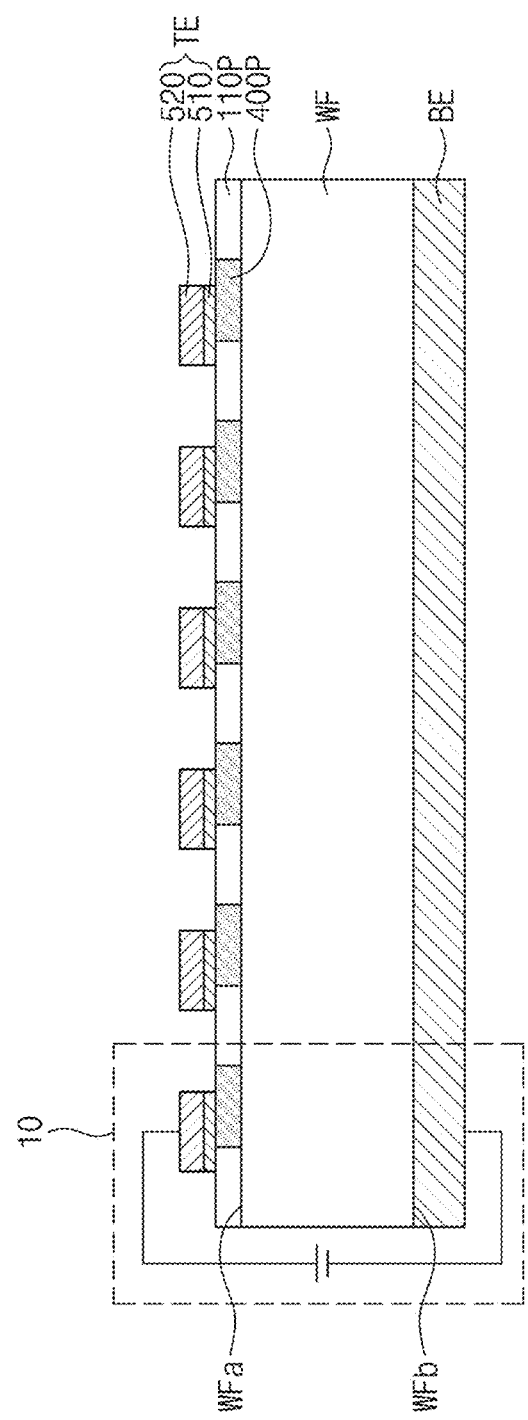

Referring to FIG. 5G, a first electrode BE may be formed on the second surface WFb of the semiconductor wafer WF. On each of the chalcogenide thin film patterns 400P, a second electrode TE may be formed. The first electrode BE and the second electrode TE may be respectively referred to as a lower electrode BE and an upper electrode TE. A semiconductor device 10 including the first and second electrodes BE and TE, the chalcogenide thin film patterns 400P, and the semiconductor wafer WF may be formed.

The upper electrode TE may include a first metal pattern 510 and a second metal pattern 520 which are sequentially laminated. As an example, the first metal pattern 510 may include titanium (Ti), and the second metal pattern 520 may include gold (Au).

Figure 6A:
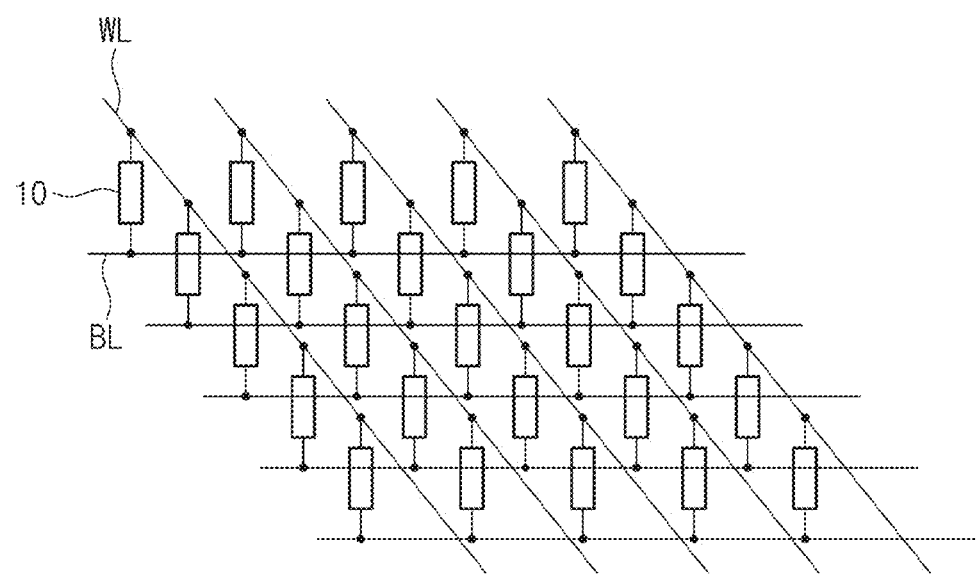
FIG. 6A is a circuit diagram conceptually showing a cell region in which a semiconductor device including a chalcogenide thin film is disposed.
Figure 6B:
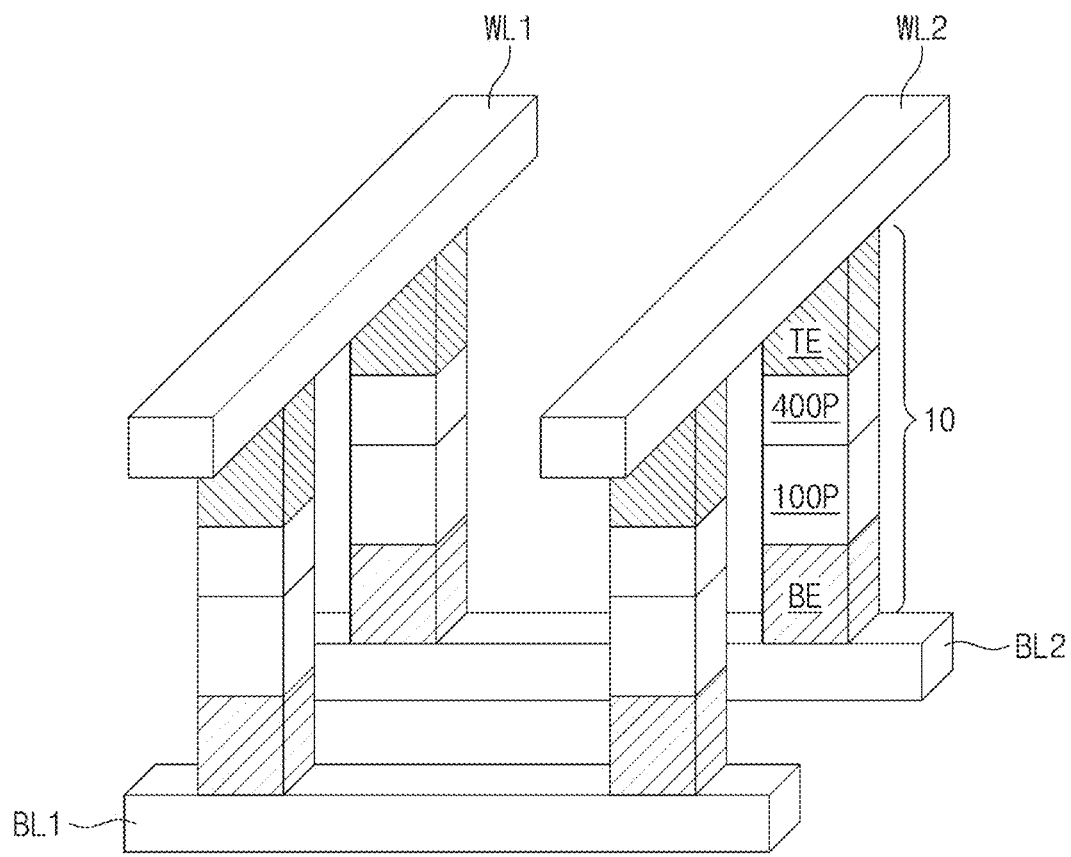
FIG. 6B is a partial enlarged view showing a portion of FIG. 6A.

FIG. 6A is a circuit diagram conceptually showing a cell region in which a semiconductor device including a chalcogenide thin film is disposed. FIG. 6B is a partial enlarged view showing a portion of FIG. 6A.

Referring to FIG. 6A, bit lines BL arranged in a first direction, and word lines WL arranged in a second direction crossing the first direction may be provided. In a region in which a bit line BL and a word line WL crosses each other, the semiconductor device 10 connected to the bit line BL and the word line WL may be provided. Each of the semiconductor devices 10 may correspond to the semiconductor device 10 of FIG. 5G.

Referring to FIG. 6B, the bit lines BL, the word lines WL, and the semiconductor devices 10 may be arranged in a cross point array form. The bit line BL and the word line WL may include a conductive material. The semiconductor device 10 may include the first electrode BE, the second electrode TE, the chalcogenide thin film pattern 400P, and a semiconductor material pattern 100P.

As an example, a first bit line BL1 and a second bit line BL2 adjacent to each other may be provided. A first word line WL1 corresponding to the first bit line BL1, and a second word line WL2 corresponding to the second bit line BL2 may be provided. The crystal direction of the chalcogenide thin film pattern 400P of a semiconductor device 10 interposed between the first bit line BL1 and the first word line WL1, and the crystal direction of the chalcogenide thin film pattern 400P of a semiconductor device 10 interposed between the second bit line BL2 and the second word line WL2 may be the same. In the entire cell region of FIG. 6A, the chalcogenide thin film patterns 400P may have the same crystal direction. In addition, each of the chalcogenide thin film patterns 400P may be single crystals.

EXAMPLES

Hereinafter, preferred embodiments of the present invention will be described. However, the embodiments are merely exemplary, and do not limit the scope of the present invention.

Forming Example 1: Forming Molybdenum Telluride (MoTe$_2$) Thin Film 40.4 mg of tellurium tetrachloride (TeCl$_4$) was dissolved in 1 mL of BMIM-BF$_4$, and then heated to 60° C. while being stirred for 30 minutes under an Ar atmosphere. Next, the mixed solution was cooled to room temperature, and then 13.7 mg of molybdenum chloride (MoCl$_5$) was additionally dissolved, and stirred for 2 to 3 hours.

A 2-inch native Si wafer was used as a carrier substrate, and a 4-inch SiO$_2$(300 nm)/Si wafer was used as a cover member. The mixed solution was disposed in the middle of the 4-inch SiO$_2$(300 nm)/Si wafer, and a polished surface of a 2-inch native Si wafer (resistivity 1-10 ohm-cm) was placed on the mixed solution.

The mixed solution was placed between the carrier substrate and the cover member, and then disposed in the center of a rotating glass plate of a single-mode variable power household microwave oven. A microwave of 200 W was irradiated for 90 to 100 seconds. Thereafter, the reaction mixture was cooled at room temperature. The cover member was removed, and then residual ionic liquid was removed by washing using a mixture in which ethanol and water were mixed in a volume ratio of 70:30 to manufacture a molybdenum telluride (MoTe$_2$) thin film on the carrier substrate.

Forming Example 2: Forming of Amorphous Carbon Thin Film Containing Tellurium Particles 150 mM of tellurium tetrachloride (TeCl$_4$) was dissolved in a toluene solution in which poly(ethylene vinylalcohol) (PEVA) was dissolved to have a weight ratio of 40 wt %. Thereafter, the mixed solution was coated on a 4-inch native Si wafer (carrier substrate) using a spin coating method. A microwave of 200 W was irradiated for 90 to 100 seconds. Thereafter, the reaction mixture was cooled at room temperature to manufacture an amorphous carbon thin film containing tellurium particles on the carrier substrate.

Forming Example 3: Forming of Silicone Oil Solution in which Tellurium Particles are Dispersed 100 g of tellurium powder was introduced to 1 ml of silicone oil. The mixed solution was placed in a mortar pestle and ground. 2 ml of toluene was added to the mixed solution. The mixed solution was stirred at room temperature. Thereafter, spin coating was performed on a carrier substrate at a rate of 6 k rpm for 60 seconds.

Forming Example 4: Forming of Tungsten Selenide (WSe$_2$) Thin Film

A tungsten selenide (WSe$_2$) thin film was formed on a conductive substrate in the same manner as in Forming Example 1 except that selenium tetrachloride (SeCl$_4$) was used instead of tellurium tetrachloride (TeCl$_4$), and tungsten chloride (WCl$_5$) was used instead of molybdenum chloride (MoCl$_5$).

Example 1: Method for Forming Silicon Telluride ($Si_2Te_3$) Thin Film

A silicon wafer having a (111) crystal plane was cleaned using acetone and ethyl alcohol. The silicon wafer was soaked in an HF aqueous solution of 2.5 to 5 wt % for 30 to 60 seconds to remove a native oxide layer on the surface of the silicon wafer. The silicon wafer from which the native oxide layer was removed was placed inside a rapid thermal annealing (RTA) heater with a polished surface facing up, and the molybdenum telluride ($MoTe_2$) thin film coated on the carrier substrate and formed according to Forming Example 1 was placed on the silicon wafer with a molybdenum telluride thin film portion facing down (so as to be in contact with the silicon wafer). Thereafter, 54 L of a 5% $H_2$/Ar mixed gas was introduced per minute into the heater, and was heated at an increase rate of 42° C. per minute. Finally, the heating was terminated after maintaining the temperature for 3 to 6 minutes at a temperature of 600 to 750° C. To cool naturally, the 5% $H_2$/Ar mixed gas was continuously introduced until the temperature was decreased to 100° C. or lower. When the temperature was decreased to 100° C. or lower, the introduction of the mixed gas was stopped, and then the carrier substrate and the silicon wafer were separated to manufacture a silicon telluride ($Si_2Te_3$) thin film having a thickness of about 30 nm on the silicon wafer.

Example 2: Method for Forming Silicon Telluride ($Si_2Te$) Thin Film

A silicon telluride ($Si_2Te_3$) thin film was formed in the same manner as in Example 1 except that the amorous carbon thin film containing tellurium particles on the carrier substrate formed according to Forming Example 2 was used instead of the molybdenum telluride ($MoTe_2$) thin film on the carrier substrate.

Example 3: Method for Forming Silicon Telluride ($Si_2Te$) Thin Film

The silicone oil solution in which tellurium particles are dispersed on the carrier substrate formed according to Forming Example 3 was used instead of the molybdenum telluride ($MoTe_2$) thin film on the carrier substrate. During heating, instead of maintaining the temperature for 3 to 6 minutes at a temperature of 600 to 750° C., the temperature was firstly maintained for 5 minutes at a temperature of about 300° C., and then the temperature was raised again, and the temperature was secondarily maintained for 3 minutes at a temperature of about 720° C. before terminating the heating.

Example 4: Forming of Germanium Telluride (GeTe) Thin Film

A germanium telluride (GeTe) thin film was formed in the same manner as in Example 1 except that a germanium substrate whose surface was a (111) crystal plane was used instead of the silicon wafer whose surface was a (111) crystal plane.

Example 5: Forming of Germanium Selenide (GeSe) Thin Film

A germanium selenide (GeSe) thin film was formed in the same manner as in Example 1 except that the tungsten selenide ($WSe_2$) thin film on the conductive substrate formed according to Forming Example 4 was used instead of the molybdenum telluride ($MoTe_2$) thin film on the conductive substrate formed according to Forming Example 1, and a germanium substrate whose surface was a (111) crystal plane was used instead of the silicon wafer whose surface was a (111) crystal plane.

Example 6: Forming of Gallium Telluride (GaTe) Thin Film

A gallium telluride (GaTe) thin film was formed in the same manner as in Example 1 except that a gallium arsenide (GaAs) substrate whose surface was a (100) crystal plane was used instead of the silicon wafer whose surface was a (111) crystal plane.

Comparative Example 1: Forming of Silicon Telluride Thin Film

A silicon telluride thin film was formed in the same manner as in Example 1 except that a silicon wafer with a (100) crystal plane was used instead of the silicon wafer with a (111) crystal plane.

Device Example 1: Method for Forming Semiconductor Device Including Silicon Telluride ($Si_2Te_3$) Thin Film In order to form a silicon telluride thin film on only a desired portion on the surface of a heavy-doped n-type silicon wafer whose surface has a (111) crystal plane, a method of locally performing a Te—Si reaction using a $SiO_2$ blocking layer was used.

First, using radio frequency (RF) sputtering, an $SiO_2$ layer of 100 nm was grown for 900 seconds at an RF power of 100 W on an $n^+$-Si(111) wafer where only a native oxide layer (native $SiO_2$) was present. Thereafter, the $SiO_2$ layer was patterned using a photoresist. AZ GEX 600 photoresist, which is a positive photoresist (a portion irradiated with UV is removed during development), was used, and MIF developer was used as a developer. The photoresist was coated on the $SiO_2$ layer of 100 nm, and then a mask which covers the rest of the portions except for a portion to be patterned was laminated on the photoresist. The mask was irradiated with UV, and a portion irradiated with UV was subjected to reactive ion etching. A mixture of 30 sccm $CF_4$ and 10 sccm Ar gas was used as an etching gas, and etching was performed for 2 minutes at an output of 50 W and a pressure of 10 mTorr. Thereafter, the photoresist present on a non-etched portion of the $SiO_2$ layer was removed.

The silicon wafer was disposed in an RTA heater with the etched portion of the $SiO_2$ layer facing up, and the molybdenum telluride ($MoTe_2$) thin film formed on the carrier substrate according to Forming Example 1 was positioned on the silicon wafer. Thereafter, heating was performed at a rate of 42° C. per minute while adding a 5% $H_2$/Ar mixed gas to the heater at 54 L/minute. Lastly, the temperature of 600 to 750° C. was maintained for 3 to 6 minutes before terminating the heating, and the 5% $H_2$/Ar mixed gas was continuously introduced until the temperature was decreased to 100° C. after natural cooling. When the temperature was decreased to 100° C., the introduction of the mixed gas was stopped, and then the molybdenum telluride ($MoTe_2$) thin film formed on the conductive substrate was separated to form a silicon telluride thin film only on the etched portion of the silicon wafer.

A Cu foil having a thickness of 250 µm was brought into contact with a lower portion of the n-type Si wafer (the opposite surface of the surface on which the silicon telluride thin film was formed) to form a first electrode (n$^+$-Si(111)/Cu).

Ti of 3 nm was deposited on the silicon telluride thin film using a thermal evaporator, and then Au of 90 nm was deposited thereon to form a second electrode (Ti/Au), thereby forming a semiconductor device.

TEST EXAMPLES

Test Example 1-1: Identifying Orientation of Silicon Telluride Thin Film Formed According to Example 1

Figure 7A:
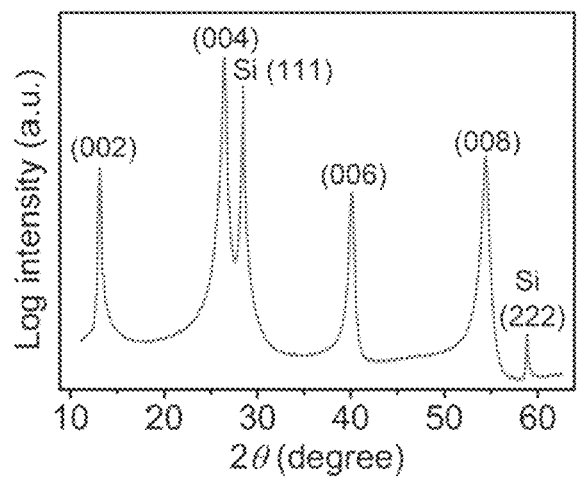
FIG. 7A shows the 1D XRD result of a silicon telluride thin film formed according to Example 1.

FIG. 7A shows the 1D XRD result of a silicon telluride thin film formed according to Example 1. Referring to FIG. 7A, by confirming that only the peaks corresponding to the (001) crystal plane of silicon telluride were detected, it is possible to identify a silicon telluride thin film having strong [0001] out-of-plane orientation, clearly showing a single-phase, and being epitaxially oriented. Accordingly, it can be seen that the silicon telluride thin film is horizontally aligned on the (111) silicon wafer.

Figure 7B:
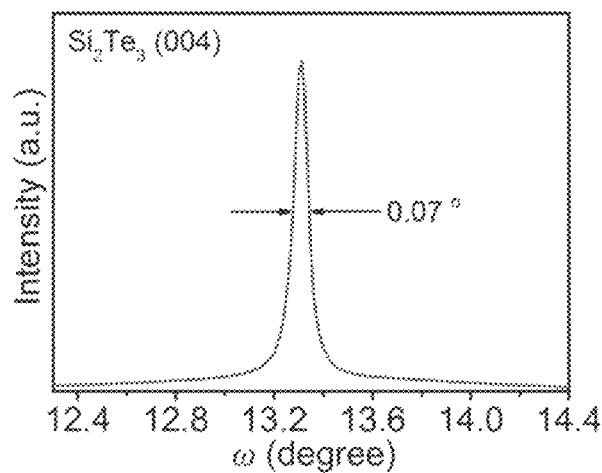
FIG. 7B shows the rocking curve result for a (004) crystal plane of a silicon telluride thin film formed according to Example 1.

FIG. 7B shows the rocking curve result for a (004) crystal plane of a silicon telluride thin film formed according to Example 1. Rocking curves may most reliably measure the average orientation of a particular crystallographic phase, and in the case of a thin film having completely random crystal grain orientation, the full-width at half-maximum (FHWM) of the rocking curve is not defined, whereas in the case of a perfectly oriented single crystal, the full width-width at half-maximum is zero (at which time, a device resolution limit is ignored). Referring to FIG. 7B, it can be confirmed that the thin film is very well aligned with respect to a (002) crystal plane since the full-width at half-maximum (FHWM) of a peek is 0.07°.

Figure 7C:
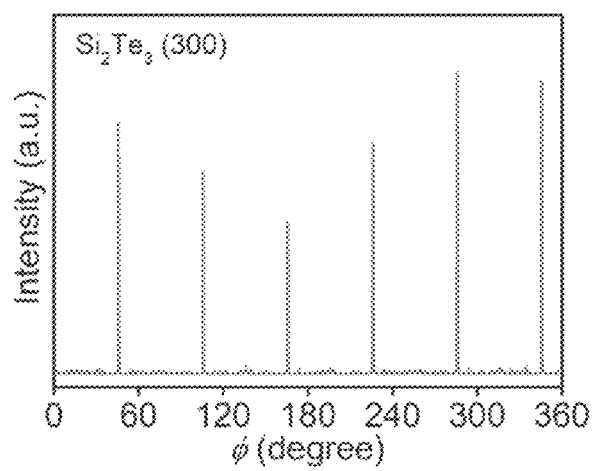
FIG. 7C shows the azimuth Φ-scan of plane (300) reflection of a silicon telluride thin film formed according to Example 1.

FIG. 7C shows the azimuth Φ-scan of plane (300) reflection of a silicon telluride thin film formed according to Example 1.

Referring to FIG. 7C, six sharp peaks appearing every 60° and having a small full width-width at half-maximum (FHWM) of 0.3° indicate a highly-aligned six-fold symmetry of a hexagonal Si$_2$Te$_3$ crystal, and it can be confirmed that the silicon telluride thin film has perfect unidirectional in plane orientation.

Figure 8A:
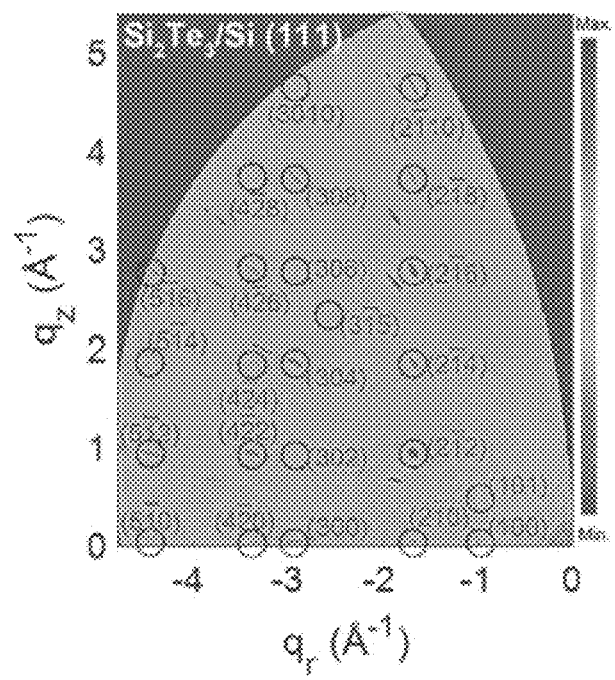
FIG. 8A is the GIWAXS analysis result of a silicon telluride thin film ($Si_2Te_3$/Si(111)) formed according to Example 1.
Figure 8B:
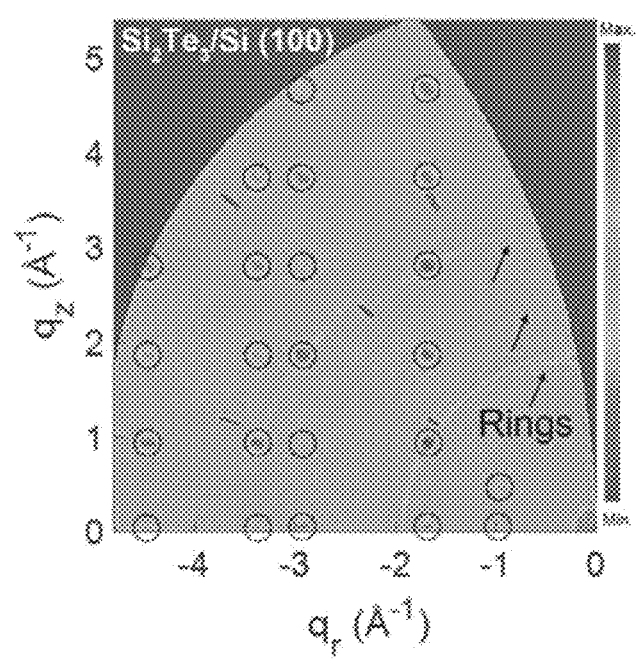
FIG. 8B is the GIWAXS analysis result of a silicon telluride thin film ($Si_2Te$/Si(100)) formed according to Comparative Example 1.

Test Example 2: Identifying Crystal Orientation of Silicon Telluride Thin Film According to Crystal Orientation of Silicon Wafer FIG. 8A is the GIWAXS analysis result of a silicon telluride thin film (Si$_2$Te$_3$/Si(111)) formed according to Example 1. FIG. 8B is the GIWAXS analysis result of a silicon telluride thin film (Si$_2$Te/Si(100)) formed according to Comparative Example 1.

Referring to FIG. 8A and FIG. 8B, the silicon telluride thin film (Example 1) synthesized using a silicon wafer having (111) crystal orientation exhibits perfect unidirectional in-plane orientation, and it can be confirmed that all atomic layers are also in the same out-of-plane lamination. On the other hand, it can be confirmed that the silicon telluride thin film (Comparative Example 1) synthesized using a silicon wafer having (100) crystal orientation is a polycrystalline film having some randomness in in-plane orientation. That is, when a silicon wafer having (111) crystal orientation is not used, epitaxy is not induced between the silicon wafer and the silicon telluride thin film, so that a non-uniform silicon telluride thin film is formed.

Test Example 3: Identifying Orientation of Silicon Telluride Thin Film Formed According to Example 2

Figure 9A:
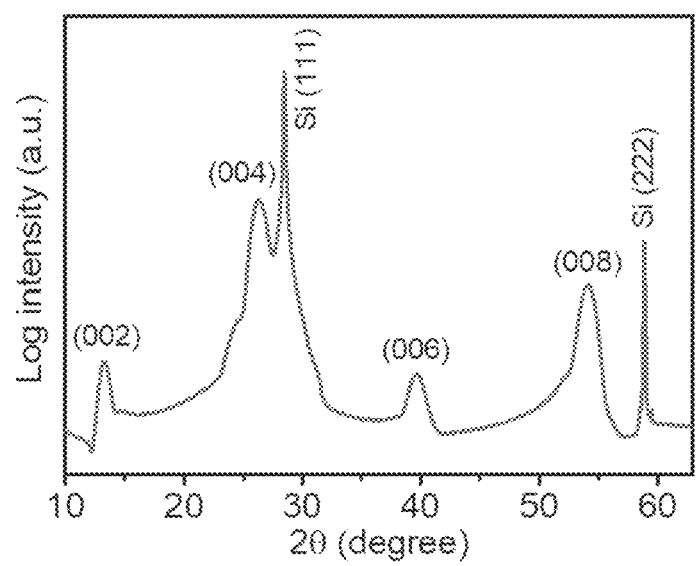
FIG. 9A shows the 1D XRD result of a silicon telluride thin film formed according to Example 2.

FIG. 9A shows the 1D XRD result of a silicon telluride thin film formed according to Example 2. Referring to FIG. 9A, it can be confirmed that a silicon telluride thin film which is epitaxially oriented is formed.

Figure 9B:
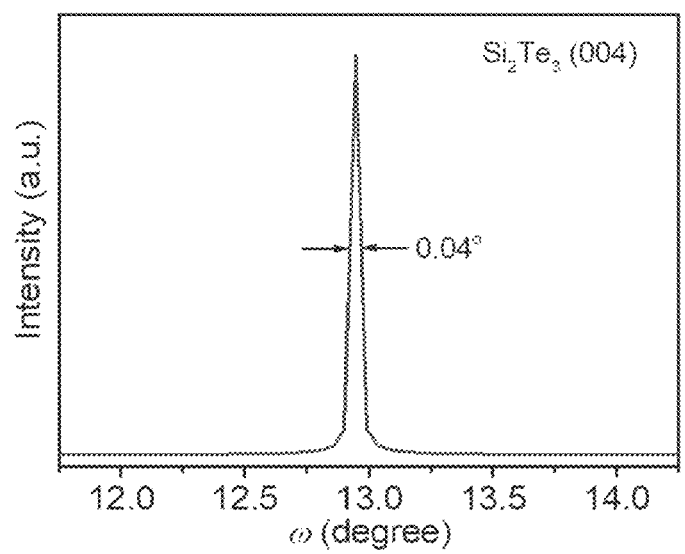
FIG. 9B shows the rocking curve result for a (004) crystal plane of a silicon telluride thin film formed according to Example 2.

FIG. 9B shows the rocking curve result for a (004) crystal plane of a silicon telluride thin film formed according to Example 2. Referring to FIG. 9B, it can be confirmed that the thin film is very well aligned with respect to a (002) crystal plane since the full-width at half-maximum (FHWM) of a peek is 0.04°.

Test Example 4: Identifying Orientation of Silicon Telluride Thin Film Formed According to Example 3

Figure 10:
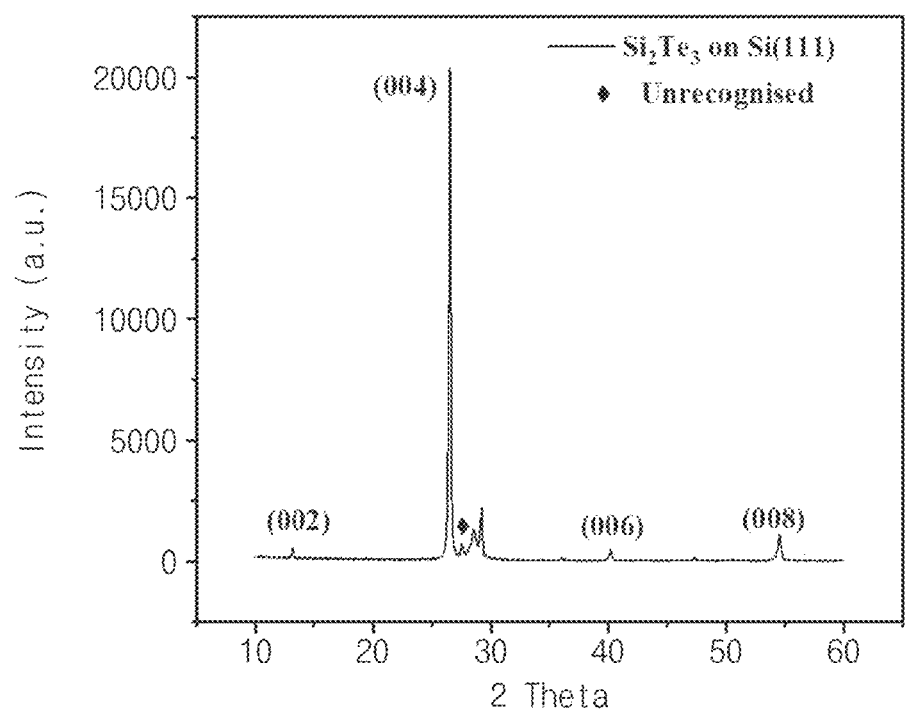
FIG. 10 shows the 1D XRD result of a silicon telluride thin film formed according to Example 3.

FIG. 10 shows the 1D XRD result of a silicon telluride thin film formed according to Example 3. Referring to FIG. 10A, it can be confirmed that a silicon telluride thin film which is epitaxially oriented is formed.

Test Example 5: Identifying Orientation of Germanium Telluride (GeTe) Thin Film Formed According to Example 4

Figure 11A:
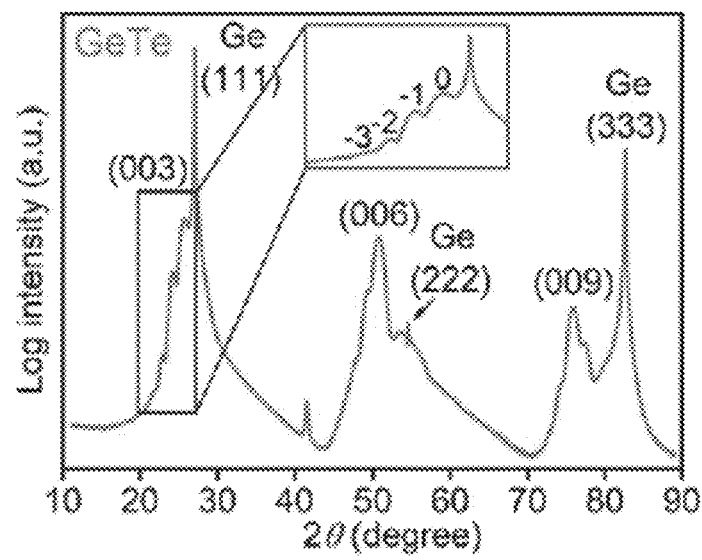
FIG. 11A shows the grazing incidence X-ray diffraction (GIXRD) for out-of-plane orientation showing only the (001) peak of a single-particle thin film of germanium telluride formed according to Example 4.

FIG. 11A shows the grazing incidence X-ray diffraction (GIXRD) for out-of-plane orientation showing only the (001) peak of a single-particle thin film of germanium telluride formed according to Example 4.

Referring to FIG. 11A, it can be confirmed that the XRD pattern shows perfectly aligned out-of-plane direction. In addition, a satellite peak of GeTe (003) (the enlarged portion of the pattern in FIG. 12A) is an interference peak observed at an interface having a uniform film thickness.

Figure 11B:
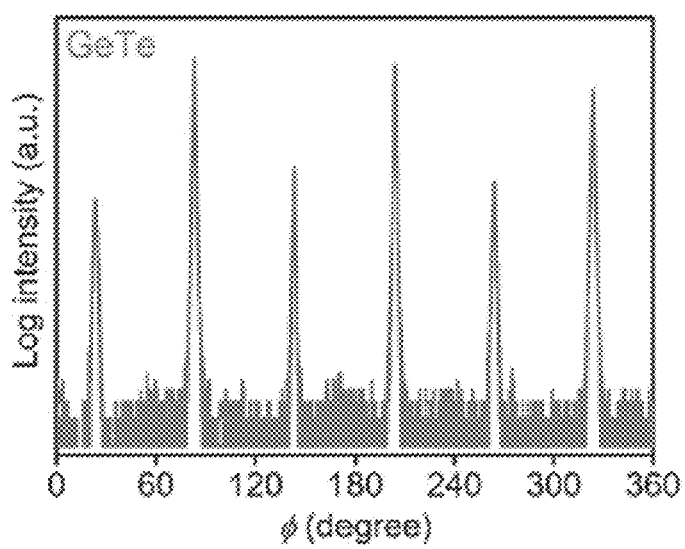
FIG. 11B shows the azimuth Φ-scan of plane (220) reflection of a germanium telluride thin film formed according to Example 4.

FIG. 11B shows the azimuth Φ-scan of plane (220) reflection of a germanium telluride thin film formed according to Example 4.

Referring to FIG. 11B, it was confirmed that six sharp peaks in the azimuthal Φ-scan of GeTe (220) had perfect unidirectional in-plane orientation together with the Ge (220) lattice.

Test Example 6: Identifying Orientation of Germanium Selenide (GeSe) Thin Film Formed According to Example 5

Figure 11C:
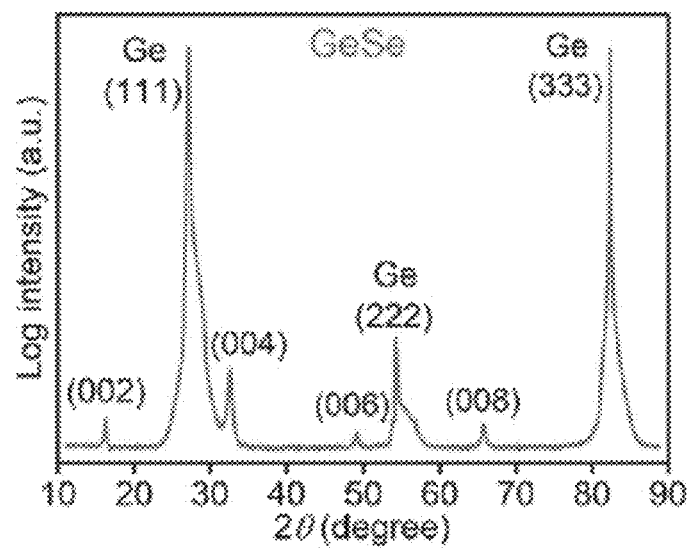
FIG. 11C shows the grazing incidence X-ray diffraction (GIXRD) for out-of-plane orientation showing only the (001) peak of a single-particle thin film of germanium selenide formed according to Example 5.

FIG. 11C shows the grazing incidence X-ray diffraction (GIXRD) for out-of-plane orientation showing only the (001) peak of a single-particle thin film of germanium selenide formed according to Example 5.

Referring to FIG. 11C, it can be confirmed that the XRD pattern shows perfectly aligned out-of-plane direction. In addition, the shoulder peak of Ge (111) is the peak of a substrate.

Test Example 7: Identifying Orientation of Gallium Telluride (GaTe) Thin Film Formed According to Example 6

Figure 11D:
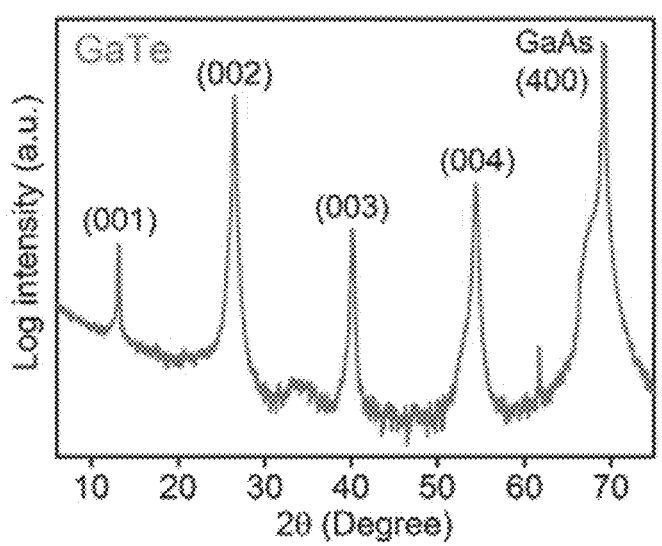
FIG. 11D shows the grazing incidence X-ray diffraction (GIXRD) for out-of-plane orientation showing only the (001) peak of a single-particle thin film of gallium telluride formed according to Example 6.

FIG. 11D shows the grazing incidence X-ray diffraction (GIXRD) for out-of-plane orientation showing only the (001) peak of a single-particle thin film of gallium telluride formed according to Example 6.

Referring to FIG. 11D, it can be confirmed that the XRD pattern shows perfectly aligned out-of-plane direction. In addition, the shoulder peak of Ga (400) is the peak of a substrate.

Test Example 8: Identifying Non-Volatile Behavior of Semiconductor Device

In order to conduct an electrical test, a bias voltage was applied to an upper electrode (second electrode) while a lower electrode (first electrode) was grounded.

Figure 12A:
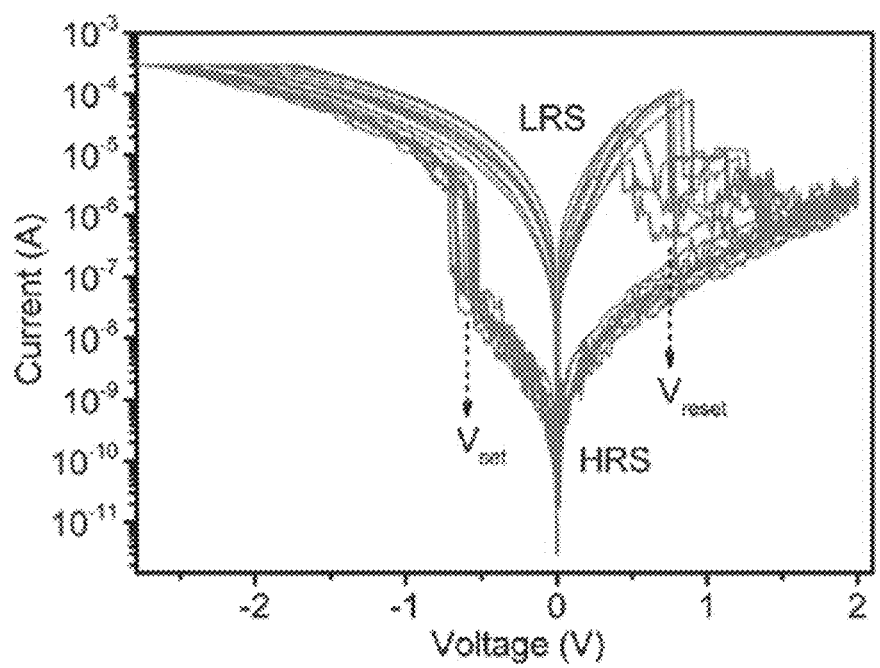
FIG. 12A shows the I-V switch operation of a semiconductor device formed according to Device Example 1 in a typical bipolar direct current.

FIG. 12A shows the I-V switch operation of a semiconductor device formed according to Device Example 1 in a typical bipolar direct current. Before the device exhibits a repeatable switching cycle, a single irreversible formation step, also known as a SET state, is set to the first step in order to switch the device from its original high resistance state (HRS) to a low resistance state (LRS).

Referring to FIG. 12A, when a negative voltage is applied to −3 V through a forming step (a blue dotted line) starting from 0 V, and then the voltage is restored back to 0 V, the device is initialized to the LRS. Thereafter, when a positive voltage is slowly applied, it is possible to observe a phenomenon in which the LRS is switched to the HRS near +1 V, and a switching voltage at this time is referred to as $V^{reset}$. After the device is switched to the HRS and the voltage is restored back to 0 V, when a positive voltage is slowly applied again, it can be seen that the HRS is switched to the LRS near +0.7 V, and a switching voltage at this time is referred to as $V_{set}$. As described above, it is possible to switch between the HRS (information of 0 is assumed to be stored) and the LRS (information of 1 is assumed to be stored) while sequentially applying 0 V-negative voltage-0 V-positive voltage-0 V to the semiconductor device formed according to Device Example 1.

Figure 12B:
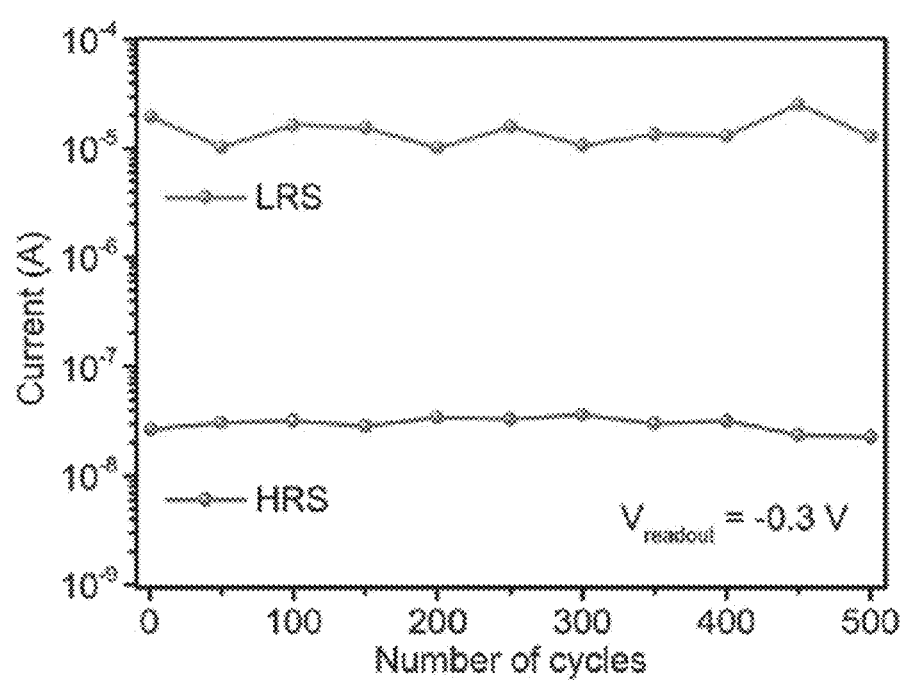
FIG. 12B shows the LRS and HRS maintenance behavior of a semiconductor device formed according to Device Example 1 during 500 cycles.

FIG. 12B shows the LRS and HRS maintenance behavior of a semiconductor device formed according to Device Example 1 during 500 cycles. Referring to FIG. 12B, the semiconductor device formed according to Device Example 1 maintains a similar current level in each cycle even after 500 cycles of switching between the HRS and the LRS, so that it can be confirmed that the device has the potential as a memory device capable of storing information of 0 and 1.

Test Example 9: Identifying Electrical Stability of Semiconductor Device

Figure 12C:
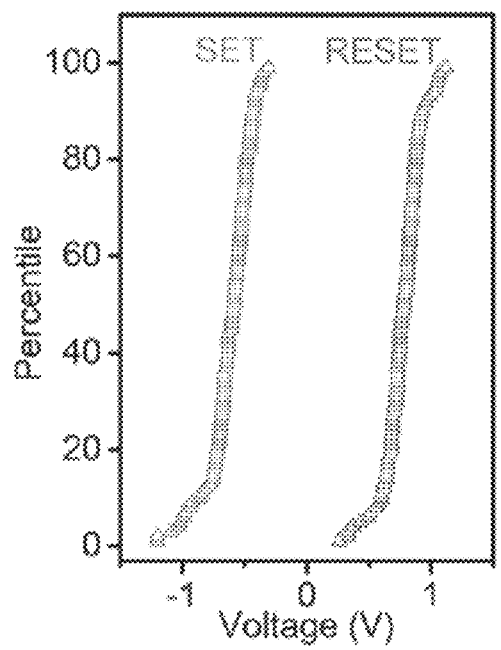
FIG. 12C shows the SET and RESET voltage distribution of a semiconductor device formed according to Device Example 1 during 100 cycles of switching.

FIG. 12C shows the SET and RESET voltage distribution of a semiconductor device formed according to Device Example 1 during 100 cycles of switching. In order for a semiconductor device to operate reliably, a set/reset voltage when the device is switched on/off several times needs to be constant. Referring to FIG. 12C, it can be confirmed that the set/reset voltage distribution was formed fairly uniformly when the semiconductor device formed according to Example 1 was switched on/off several times.

Figure 12D:
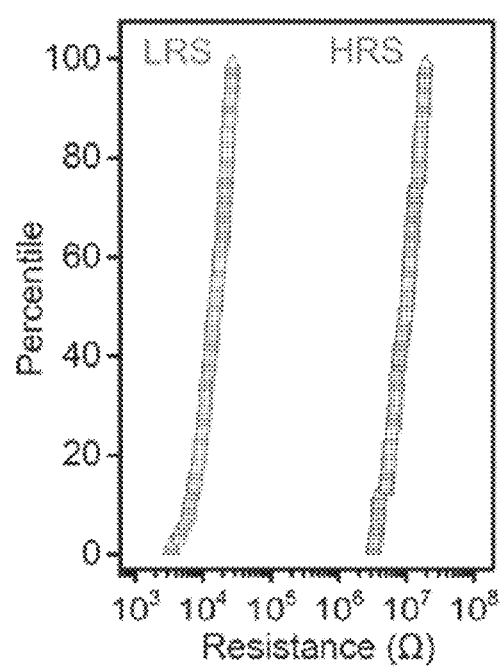
FIG. 12D shows the resistance value distribution of a semiconductor device formed according to Device Example 1 in LRS and HRS during 100 cycles of switching.

FIG. 12D shows the resistance value distribution of a semiconductor device formed according to Device Example 1 in LRS and HRS during 100 cycles of switching. Referring to FIG. 12D, the resistance distribution of HRS and LRS of the semiconductor device formed according to Device Example 1 at a −0.3V bias after 100 cycles can be identified, which shows a memory window of more than 600× even when a programming voltage is low.

Figure 12E:
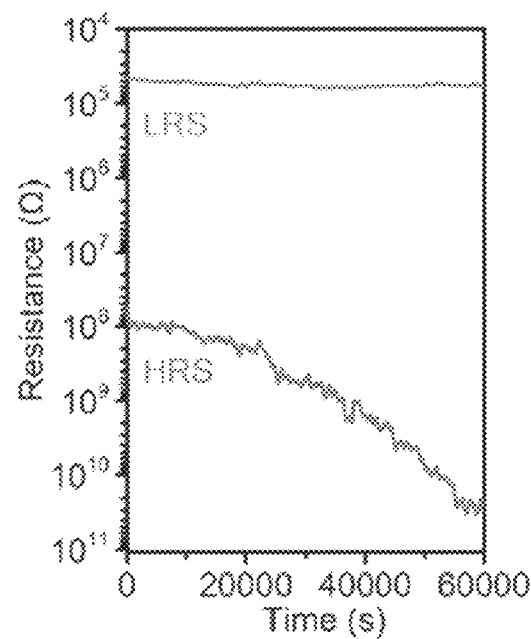
FIG. 12E shows the resistance change behavior of a semiconductor device formed according to Device Example 1 when a read voltage of −0.3 V is applied for a long time at room temperature.

FIG. 12E shows the resistance change behavior of a semiconductor device formed according to Device Example 1 when a read voltage of −0.3 V is applied for a long time at room temperature.

Referring to FIG. 12E, it can be confirmed that for 60,000 seconds (about 16 hours and 40 minutes), there is almost no change in resistance in the LRS state, and that resistance gradually increases in the HRS state. Such a behavior appears in many semiconductor devices, and does not cause a problem with device operation. In addition, it can be seen that data may be retained for longer than 60,000 seconds (about 16 hours and 40 minutes) at a reading bias of −0.3 V. Long data retention indicates that a conduction path is trapped in a very small area, which effectively suppresses the diffusion of an electrode material causing reduced retention.

Test Example 10: Identifying on/Off Switching Behavior of Semiconductor Device

Figure 12F:
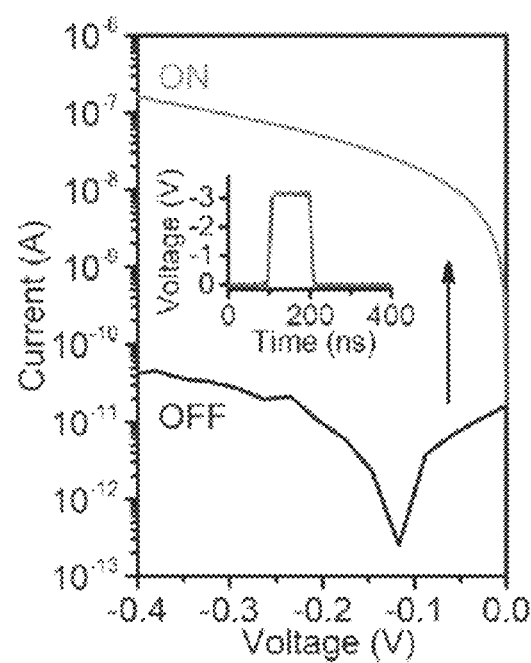
FIG. 12F shows the I-V graph when a semiconductor device formed according to Device Example 1 is switched from OFF to ON by being applied with a set/reset voltage for a short time of 100 ns.
Figure 12G:
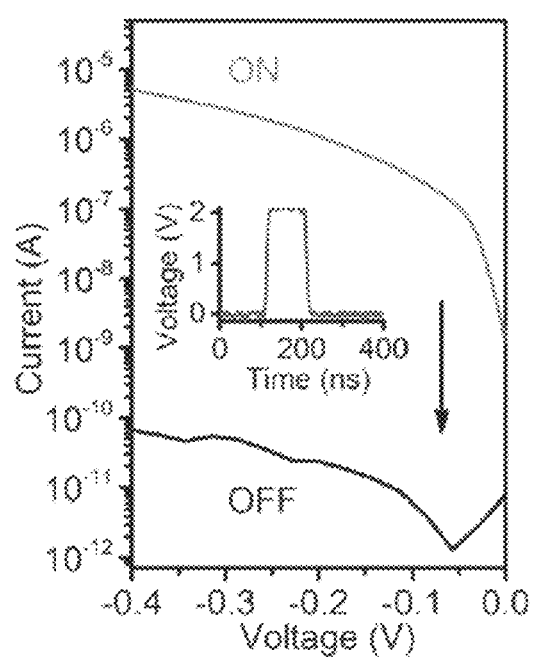
FIG. 12G shows the I-V graph when a semiconductor device formed according to Device Example 1 is switched from ON to OFF by being applied with a set/reset voltage for a short time of 100 ns.

FIG. 12F shows the I-V graph when a semiconductor device formed according to Device Example 1 is switched from OFF to ON by being applied with a set/reset voltage for a short time of 100 ns. FIG. 12G shows the I-V graph when a semiconductor device formed according to Device Example 1 is switched from ON to OFF by being applied with a set/reset voltage for a short time of 100 ns.

Referring to FIG. 12F and FIG. 12G, when a set/reset voltage is applied for 100 ns to the semiconductor device formed according to Device Example 1, the device is easily switched to the opposite state, so that it can be confirmed that it is possible to quickly store and erase data in the semiconductor device according to the inventive concept.

According to the inventive concept, it is possible to form a large-area single-crystal silicone telluride by allowing any one among molybdenum telluride ($MoTe_2$), amorphous carbon containing tellurium particles, and silicon oil in which tellurium particles are dispersed to come into contact with an upper surface of a silicon wafer, and then performing heat treatment.

The above description of the embodiments of the inventive concept provides examples for the description of the inventive concept. Therefore, the inventive concept is not limited to the above embodiments, and it is apparent that many modifications and changes may be made, such as by combining the above embodiments by those of ordinary skill in the art within the inventive concept.

What is claimed is:

1. A method for forming a chalcogenide thin film, the method comprising:
    forming a chalcogen element-containing film on a carrier substrate;
    disposing the chalcogen element-containing film on a silicon wafer, wherein a surface of the silicon wafer and a surface of the chalcogen element-containing film are in contact with each other;
    performing heat treatment on the silicon wafer and the chalcogen element-containing film at least one time; and
    removing the carrier substrate,
    wherein the silicon wafer has a crystal plane of (111).

2. The method of claim 1, wherein the carrier substrate comprises a conductive substrate.

3. The method of claim 1, further comprising, before the forming of a chalcogen element-containing film, forming a barrier film on the carrier substrate.

4. The method of claim 3, wherein the barrier film is any one selected from the group consisting of $SiO_2$, $GeO_2$, GeO, GaO, and $GaO_3$.

5. The method of claim 1, wherein the forming of a chalcogen element-containing film comprises:
coating a mixed solution including a transition metal precursor, a chalcogenide precursor, and an ionic solvent on the carrier substrate; and
irradiating the carrier substrate and the mixed solution with microwaves.

6. The method of claim 1, wherein the forming of a chalcogen element-containing film comprises:
forming a mixed solution by dissolving a chalcogenide precursor in a polymer solution;
coating the mixed solution on the carrier substrate; and
irradiating the carrier substrate and the mixed solution with microwaves.

7. The method of claim 6, wherein the chalcogenide precursor comprises $TeCl_4$, and the polymer solution comprises poly(ethylene vinylalcohol) (PEVA).

8. The method of claim 1, wherein the forming of a chalcogen element-containing film comprises:
forming a mixed solution by dispersing chalcogen particles in silicone oil; and
coating the mixed solution on the carrier substrate.

9. The method of claim 8, wherein the heat treatment comprises a first heat-treatment process and a second heat-treatment process after the first heat-treatment process, wherein:
the first heat-treatment process is performed for a first period of time at a first temperature; and
the second heat-treatment process is performed for a second period of time at a second temperature, wherein:
the first temperature is lower than the second temperature; and
the first period of time is longer than the second period of time.

10. The method of claim 8, wherein the coating of the mixed solution on the carrier substrate comprises a spin coating method.

11. The method of claim 1, wherein the chalcogen element-containing film comprises any one among molybdenum telluride ($MoTe_2$), amorphous carbon containing tellurium particles, and silicone oil in which tellurium particles are dispersed.

12. A method for forming a chalcogenide thin film, the method comprising:
preparing a carrier substrate on which a barrier layer is formed;
forming a chalcogen element-containing film on the barrier layer;
forming an insulation pattern on a semiconductor substrate, wherein the insulation pattern exposes a portion of the upper surface of the semiconductor substrate;
disposing the chalcogen element-containing film on the insulation pattern, wherein the chalcogen element-containing film comes into contact with the exposed upper surface of the semiconductor substrate; and
performing heat treatment on the semiconductor substrate and the chalcogen element-containing film at least one time.

13. The method of claim 12, wherein the carrier substrate comprises a conductive substrate.

14. The method of claim 12, wherein the forming of a chalcogen element-containing film comprises:
coating a mixed solution including a molybdenum precursor, a telluride precursor, and an ionic solvent on the carrier substrate; and
irradiating the carrier substrate and the mixed solution with microwaves.

15. The method of claim 12, wherein the forming of a chalcogen element-containing film comprises:
forming a mixed solution by dissolving a chalcogenide precursor in a polymer solution;
coating the mixed solution on the carrier substrate; and
irradiating the carrier substrate and the mixed solution with microwaves.

16. The method of claim 12, wherein the forming of a chalcogen element-containing film comprises:
forming a mixed solution by dispersing chalcogen particles in silicone oil; and
coating the mixed solution on the carrier substrate.

17. The method of claim 12, wherein the heat treatment is performed under an inert gas atmosphere.

18. The method of claim 12, wherein the chalcogen element-containing film comprises any one among molybdenum telluride ($MoTe_2$), amorphous carbon containing tellurium particles, and silicon oil in which tellurium particles are dispersed.

* * * * *